US009235137B2

(12) United States Patent
Fiolka et al.

(10) Patent No.: US 9,235,137 B2
(45) Date of Patent: Jan. 12, 2016

(54) ILLUMINATION OPTICAL UNIT FOR MICROLITHOGRAPHY

(75) Inventors: Damian Fiolka, Oberkochen (DE); Ralf Stuetzle, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 412 days.

(21) Appl. No.: 13/370,829

(22) Filed: Feb. 10, 2012

(65) Prior Publication Data

US 2012/0162627 A1 Jun. 28, 2012

Related U.S. Application Data

(63) Continuation of application No. PCT/EP2010/064242, filed on Sep. 27, 2010.

(30) Foreign Application Priority Data

Sep. 30, 2009 (DE) .......................... 10 2009 045 135

(51) Int. Cl.
G03B 27/72 (2006.01)
G03F 7/20 (2006.01)
G02B 27/09 (2006.01)
(Continued)

(52) U.S. Cl.
CPC ........ *G03F 7/70233* (2013.01); *G02B 27/0905* (2013.01); *G02B 27/0977* (2013.01); *G03F 7/702* (2013.01); *G03F 7/70075* (2013.01); *G03F 7/70116* (2013.01); *G03F 7/70175* (2013.01); *G03F 7/70566* (2013.01); *G21K 1/06* (2013.01); *G21K 1/16* (2013.01); *G21K 2201/06* (2013.01); *G21K 2201/064* (2013.01); *G21K 2201/067* (2013.01)

(58) Field of Classification Search
CPC .................. G03F 7/70075; G03F 7/70566
USPC ............................ 355/71; 359/352
See application file for complete search history.

(56) References Cited

U.S. PATENT DOCUMENTS 6,658,084 B2 12/2003 Singer
6,859,328 B2 2/2005 Schultz et al.
8,253,925 B2 * 8/2012 Ossmann ............ G03F 7/70075
355/67

(Continued)

FOREIGN PATENT DOCUMENTS

DE 100 53 587 A1 5/2002
DE 103 27 963 1/2005
(Continued)

OTHER PUBLICATIONS

Translation of JP 2006-128321 A.*
(Continued)

*Primary Examiner* — Deoram Persaud
(74) *Attorney, Agent, or Firm* — Fish & Richardson P.C.

(57) ABSTRACT

An illumination optical unit includes a collector mirror which produces a polarization distribution that is applied to the first faceted optical element during the operation of the illumination optical unit. There are at least two first facet elements to which radiation having a differing polarization is applied. The first faceted optical element has at least one first state in which the normal vectors of the reflective surfaces of the first facet elements are selected so that a first predetermined polarization distribution results at the location of the object field during the operation of the illumination optical unit.

23 Claims, 8 Drawing Sheets

(51) Int. Cl.
*G21K 1/06* (2006.01)
*G21K 1/16* (2006.01)

(56) References Cited

U.S. PATENT DOCUMENTS

| | | | |
|---|---|---|---|
| 8,395,754 B2* | 3/2013 | Endres | G03F 7/70075 355/52 |
| 2002/0136351 A1* | 9/2002 | Singer | B82Y 10/00 378/34 |
| 2003/0227606 A1* | 12/2003 | Sweatt | G03F 7/70083 355/53 |
| 2005/0174650 A1* | 8/2005 | Melzer | G02B 26/0816 359/627 |
| 2006/0132747 A1 | 6/2006 | Singer et al. | |
| 2006/0175556 A1 | 8/2006 | Yabuki | |
| 2006/0221453 A1 | 10/2006 | Koehler et al. | |
| 2007/0058151 A1* | 3/2007 | Eurlings et al. | G02B 5/1819 355/71 |
| 2007/0058244 A1 | 3/2007 | Singer | |
| 2007/0195305 A1 | 8/2007 | Mulder et al. | |
| 2007/0273859 A1* | 11/2007 | Komatsuda | G03F 7/702 355/67 |
| 2009/0213345 A1 | 8/2009 | Mann | |
| 2011/0122392 A1* | 5/2011 | Fiolka | G03F 7/70075 355/71 |

FOREIGN PATENT DOCUMENTS

| | | |
|---|---|---|
| DE | 10 2008 009 600 A1 | 8/2009 |
| EP | 1 306 665 A2 | 5/2003 |
| JP | 2003-057801 | 2/2003 |
| JP | 2006-128321 A | 5/2006 |
| JP | 2006128321 A * | 5/2006 |
| JP | 2006-196715 | 7/2006 |
| JP | 2006-216917 | 8/2006 |
| JP | 2007-027226 | 2/2007 |
| JP | 2007-515766 A | 6/2007 |
| JP | 2007-227918 A | 9/2007 |
| JP | 2008-541418 | 11/2008 |
| WO | WO 2004/100236 | 11/2004 |
| WO | WO 2006/111319 A2 | 10/2006 |
| WO | WO 2007/138805 | 12/2007 |
| WO | WO 2009/100856 | 8/2009 |
| WO | WO 2009/100856 A1 | 8/2009 |

OTHER PUBLICATIONS

Japanese Office Action, with translation thereof, for corresponding JP Appl No. 2012-531343, dated Jul. 24, 2013.
Korean Office Action, with translation thereof, for corresponding KR Appl No. 9-5-2013-041502215, dated Jun. 18, 2013.
The International Search Report and Written Opinion for corresponding PCT Appl No. PCT/EP2010/064242, dated Jan. 27, 2011.
Chinese Office Action, with translation thereof, for corresponding CN Appl No. 201080043764.9, dated Feb. 8, 2014.
Japanese Office Action, with translation thereof, for JP Appl No. 2012-531343, dated Feb. 26, 2014.
Chinese Office Action, with translation thereof, for corresponding CN Appl No. 201080043764.9, dated Sep. 2, 2013.
Chinese Office Action, with translation thereof, for CN Appl No. 201080043764.9, dated Jun. 5, 2014.
Chinese Office Action, with translation thereof, for CN Application 201080043764.9, dated Feb. 17, 2015.
Wang Liping, "Optical system of extreme ultraviolet lithography", Chinese Journal of Optics and Applied Optics (2010), vol. 3, No. 5. (Translation of abstract; Part 2—paragraph 2 and Part 3.2—section (3)).

* cited by examiner

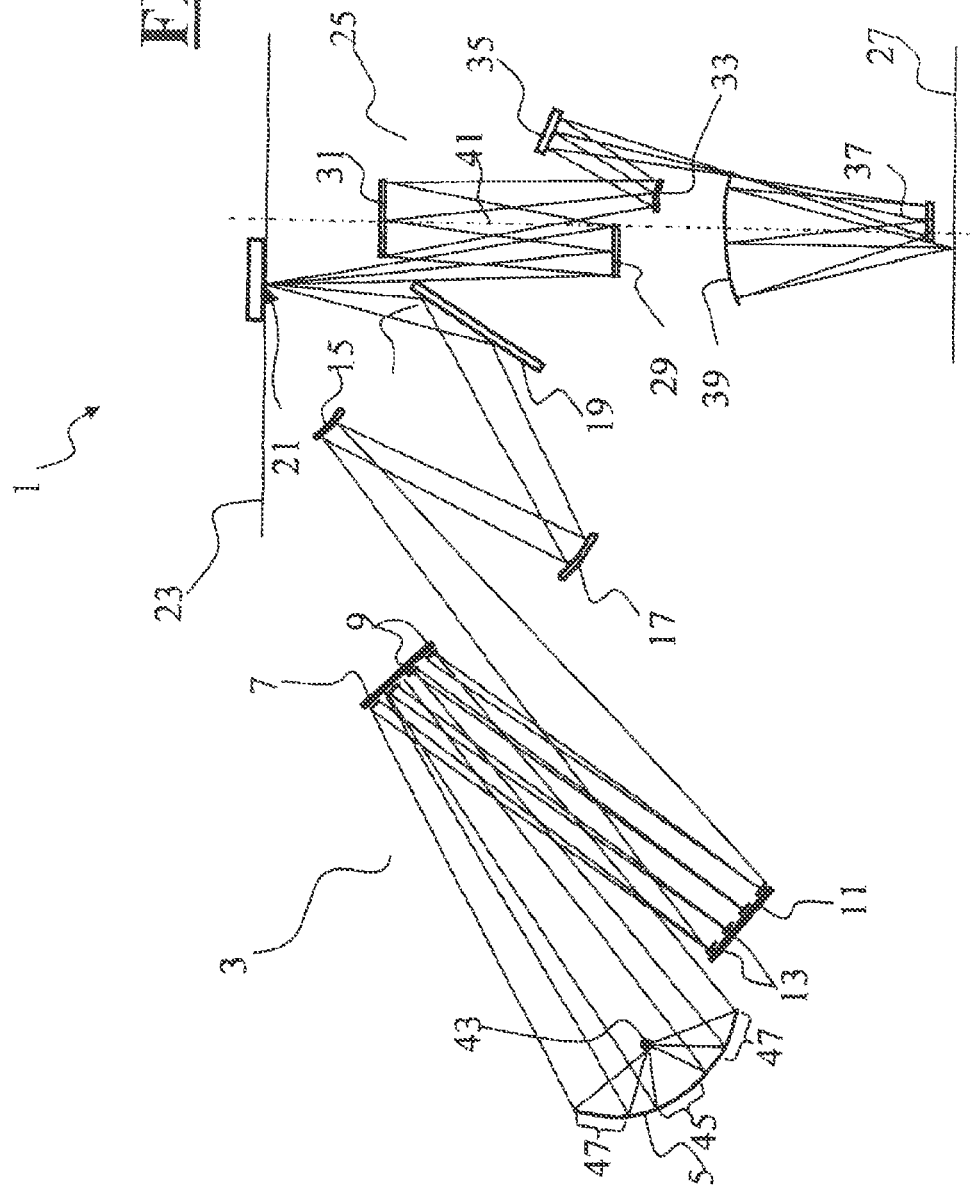

ILLUMINATION OPTICAL UNIT FOR MICROLITHOGRAPHY

CROSS-REFERENCE TO RELATED APPLICATIONS

This application is a continuation of, and claims benefit under 35 USC 120 to, international application PCT/EP2010/064242, filed Sep. 27, 2010, which claims benefit under 35 USC 119 of German Application No. 10 2009 045 135.8, filed Sep. 30, 2009. International application PCT/EP2010/064242 is hereby incorporated by reference in its entirety.

FIELD

The disclosure relates to an illumination optical unit for EUV microlithography, as well as a projection exposure apparatus including such an illumination optical unit.

BACKGROUND

A projection exposure apparatus for EUV microlithography is known from U.S. Pat. No. 6,859,328 and from WO 2006/111319 A2.

In microlithography it is often desirable to illuminate a structure to be imaged with a predetermined polarization distribution because this can improve the contrast during imaging downstream of the structure. For this purpose, additional polarization elements have been used in the illumination optical unit, but the elements also absorb part of the radiation and thus can reduce the total transmission of the illumination optical unit.

SUMMARY

The disclosure provides an illumination optical unit for EUV microlithography which provides a polarization distribution can be set in a relatively simple manner.

In some embodiments, an illumination optical unit includes a collector mirror which produces a polarization distribution that is applied to the first faceted optical element during the operation of the illumination optical unit. There are at least two first facet elements to which radiation having a differing polarization is applied. The first faceted optical element has at least one first state in which the normal vectors of the reflective surfaces of the first facet elements are selected so that a first predetermined polarization distribution results at the location of the object field during the operation of the illumination optical unit.

According to the disclosure it has been recognized that the polarization distribution produced by a collector mirror within the illumination optical unit can be used to produce a polarization distribution at the location of the object field to be illuminated by suitably choosing the normal vectors of the reflective surfaces of facet elements of a first faceted optical element. This has the advantage that the illumination optical unit can be cost-effective and simple to produce because no additional polarization elements have to be used.

In one configuration according to the disclosure, the illumination optical unit is configured so that the polarization distribution that is produced by the collector mirror and is applied to the first faceted optical element during the operation of the illumination optical unit differs from the predetermined polarization distribution at the location of the object field.

This allows a good adaptation of the polarization distribution at the location of the object field to the structures of the structure-bearing mask that is imaged via the downstream projection optical unit.

In one configuration of the illumination optical unit, the first predetermined polarization distribution is different at at least two locations in the object field. This enables the polarization distribution to be adapted even better to a structure-bearing mask whose structures are different at different locations in the object field.

In a further configuration of the illumination optical unit, the first predetermined polarization distribution is a tangential polarization distribution at at least one location of the object field. A tangential polarization distribution allows a particularly high resolution during the imaging of the structure-bearing mask into the image plane of the projection optical unit.

In another configuration of the illumination optical unit, the angular distribution of the incident radiation has a dipole form at at least one location of the object field and the polarization distribution at this location is such that in each pole the principal polarization direction is perpendicular to the principal dipole axis. The principal polarization direction is understood to mean the polarization direction in which the maximum intensity is present. A dipole-type angular distribution has the advantage that structures whose preferred direction is perpendicular to the principal dipole direction can be imaged with particularly high contrast with the aid of such illumination radiation. A simultaneous polarization distribution at this location, wherein the principal polarization direction is perpendicular to the principal dipole axis, therefore can allow a particularly high-resolution imaging with a good contrast.

In certain embodiments, an illumination optical unit for EUV microlithography includes a collector mirror and a first faceted optical element having a plurality of first facet elements for illuminating an object field in an object plane. Each first facet element has a reflective surface with a normal vector whose direction defines the orientation of the reflective surface spatially. The illumination optical unit also includes a second faceted optical element having second facet elements for the superimposing imaging of the first facet elements onto the object field. For this purpose, the collector mirror produces a polarization distribution that is applied to the first faceted optical element during the operation of the illumination optical unit, and there are at least two first facet elements to which radiation having a differing polarization is applied. In this case, the first faceted optical element has at least one first state in which the normal vectors of the reflective surfaces of the first facet elements are selected so that a first predetermined polarization distribution results on the second faceted optical element during the operation of the illumination optical unit.

In one embodiment of the disclosure, the first predetermined polarization distribution is a tangential polarization distribution, in which the proportion of the radiation in the tangentially directed principal polarization direction increases from a center of the second faceted optical element outward. This has the advantage that a high proportion of the radiation in the tangentially directed principal polarization direction is present, in particular, at the location of second facet elements that are arranged relatively far toward the outside. Because radiation that is forwarded by such facet elements into the object field can make a particularly great contribution to image production during the imaging of a structure-bearing mask arranged at the location of the object field, a particularly good contrast can result if a high proportion of the radiation in the tangentially directed principal polarization direction is present exactly on these facet elements.

In one configuration of the illumination optical unit, at least one portion of the first facet elements has a plurality of positions. For at least one of the first facet elements of the portion of the first facet elements, the direction of the normal vector of the optical surface in a first position differs from the direction of the normal vector of the reflective surface in a second position. This makes it possible to vary, during the operation of the illumination optical unit, the angular distribution of the incident radiation at at least one location of the object field by altering the direction of the normal vectors, such that, when the structure-bearing mask is exchanged, the angular distribution can be adapted to the new mask.

In this case, the first faceted optical element can have at least one second state, wherein the first and second states differ in that at least one portion of the first facet elements assume different positions. The normal vectors of the reflective surfaces of the first facet elements in the second state are selected so that a second predetermined polarization distribution results at the location of the object field during the operation of the illumination optical unit. The first and second polarization distributions differ in this case. As a result, it is also possible to adapt the polarization distribution at the location of the object field to a changed mask.

In one embodiment of the disclosure, the collector mirror is embodied as a double collector for increasing the degree of polarization. This results in a higher degree of polarization on the first faceted element in comparison with one collector, in which the radiation is reflected only once.

For altering the polarization distribution or for increasing the degree of polarization, it is known to use polarization elements in illumination systems for EUV microlithography. Such polarization elements are known for example from EP 1 306 665 A2, DE 103 27 963 A1 and US 2006/0221453 A1. With regard to the embodiment of polarization elements, reference is made to these documents.

According to the disclosure, the illumination optical unit in one configuration is embodied so that no polarization element is arranged in the beam path between collector mirror and first faceted optical element. This has the advantage that the intensity of the radiation is not reduced by absorption at the polarization elements, and furthermore that the illumination optical unit, can contain particularly few optical elements and is therefore cost-effective to produce.

In an alternative design, a polarization element is arranged in the beam path between the collector mirror and the first faceted optical element, for the purpose of altering the polarization distribution produced by the collector mirror. This enables the polarization distribution produced by the collector mirror to be adapted further in order to be able to set the predetermined polarization distribution at the object field more precisely.

In one embodiment, no polarization element is arranged in the beam path between the first faceted optical element and the object field. This has the advantage that the intensity of the radiation is not reduced by absorption at the polarization elements, and furthermore that the illumination optical unit contains particularly few optical elements and is therefore cost-effective to produce.

In one form of the illumination optical unit according to the disclosure, the illumination optical unit includes a second faceted optical element having second facet elements for the superimposing imaging of the first facet elements onto the object field. This is a well-known design of an illumination optical unit which makes it possible to achieve a uniform illumination of the object field with radiation having a uniform angular distribution.

As an alternative, the illumination optical unit can also be embodied in the form of a specular reflector, known from US 2006/0132747 A1.

A projection exposure apparatus including an illumination optical unit described above has the advantages explained with regard to the illumination optical unit.

BRIEF DESCRIPTION OF THE DRAWINGS

The disclosure will be explained in greater detail with reference to the drawings, in which:

FIG. 1 shows an embodiment of a projection exposure apparatus including an illumination optical unit according to the disclosure;

DETAILED DESCRIPTION

Figure 2A:
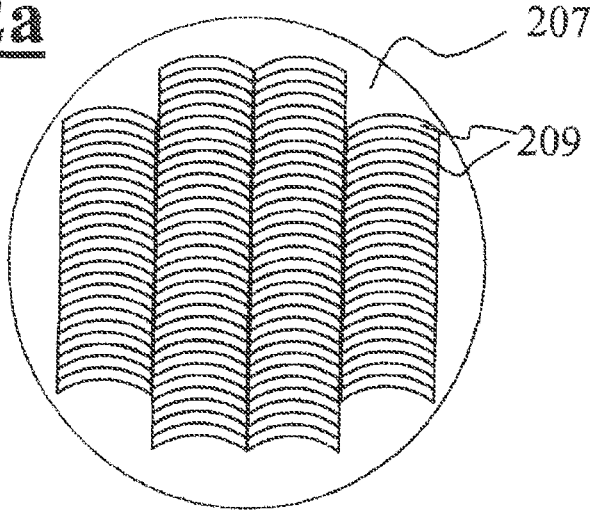
FIG. 2a schematically shows a plan view of the first faceted optical element of the illumination optical unit according to FIG. 1.

The reference signs have been chosen such that objects illustrated in FIG. 1 have been provided with single-digit or two-digit numerals. The objects illustrated in the further figures have reference signs having three or more digits, the last two digits indicating the object and the preceding digit indicating the number of the figure in which the object is illustrated. Therefore, the reference numerals of identical objects illustrated in a plurality of figures correspond in terms of the last two digits.

FIG. 1 shows a configuration of a projection exposure apparatus 1 according to the disclosure including an illumination optical unit 3. In this case, the illumination optical unit 3 includes a collector mirror 5, a first reflective optical element 7 having first facet elements 9, and a second reflective optical element 11 having a plurality of second facets elements 13. A first telescope mirror 15 and a second telescope mirror 17 are arranged in the light path downstream of the second reflective optical element 11, both of the mirrors being operated with normal incidence, that is to say that the radiation impinges on both mirrors at an angle of incidence of between 0° and 45°. Arranged downstream is a deflection mirror 19, which directs the radiation impinging on it onto the object field 21 in the object plane 23. The deflection mirror 19 is operated with grazing incidence, that is to say that the radiation impinges on the mirror at an angle of incidence of between 45° and 90°. A structure-bearing mask is arranged at the location of the object field 21, the mask being imaged into the image plane 27 with the aid of the projection optical unit 25. The projection optical unit includes six mirrors 29, 31, 33, 35, 37 and 39. All six mirrors of the projection optical unit have a reflective surface that runs along a surface that is rotationally symmetrical about the optical axis 41.

FIG. 2a shows a plan view of the first reflective faceted optical element 207, which includes a plurality of first facet elements 209.

Figure 2B:
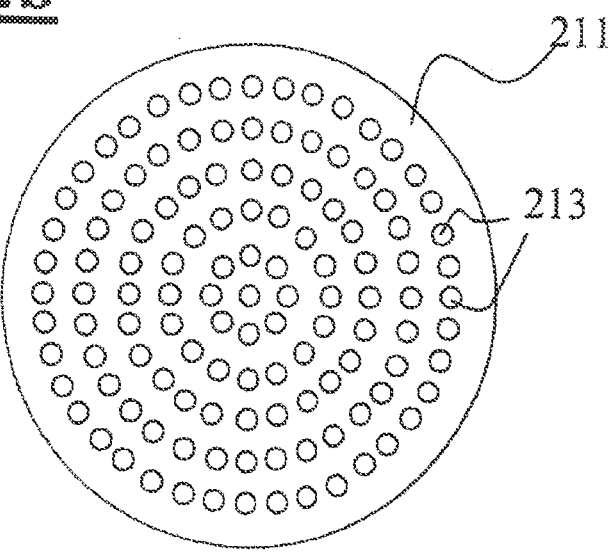
FIG. 2b schematically shows a plan view of the second faceted optical element of the illumination optical unit according to FIG. 1.

FIG. 2b shows a corresponding plan view of the second faceted reflective optical element 211 having the second facet elements 213. The number of first facet elements 9 can be exactly equal to or greater or less than the number of second facet elements 13.

During the operation of the illumination optical unit, the collector mirror 5 reflects the radiation emerging from a light source 43 in the direction of the first faceted optical element 7. Consequently, the radiation reflected by the collector mirror 5 is applied to the first faceted optical element 7. The light source 43 can be embodied in various embodiments. It can be a laser plasma source (LPP), in which a narrowly delimited source plasma is generated by irradiating a small material droplet with a high-energy laser. As an alternative, a discharge source can be involved, in which the source plasma is generated with the aid of a discharge. In both cases, a luminous source plasma occurs which emits radiation in particular in the wavelength range of 5 nm to 20 nm. The radiation is collected with the aid of the collector mirror 5 and thus applied to the first reflective optical element 7. In this case, the collector mirror 5 and the first facet elements 9 have an optical effect such that images of the source plasma results at the locations of the facet elements 13 of the second reflective faceted optical element 11. For this purpose, firstly the focal lengths of the collector mirror 5 and of the first facet elements 9 are chosen in accordance with the spatial distances to. Secondly, the first facet elements 9 have a reflective surface with a normal vector whose direction defines the orientation of the reflective surface spatially. According to the disclosure, the normal vectors of the reflective surface of the first facet elements 9 are selected, i.e. oriented, such that the radiation reflected by a first facet element 9 impinges on a specific predetermined second facet element 13. With the aid of the second facet elements 13 and the downstream optical unit including the mirrors 15, 17 and 19, the first facet elements 9 are imaged in superimposing fashion onto the object field 21 in the object plane 23. The form of the illuminated object field 21 therefore corresponds to the outer form of the first facet elements 9 and is arcuate so that the long boundary lines run substantially in circle arc form about the optical axis 41 of the projection optical unit 25.

Figure 3:
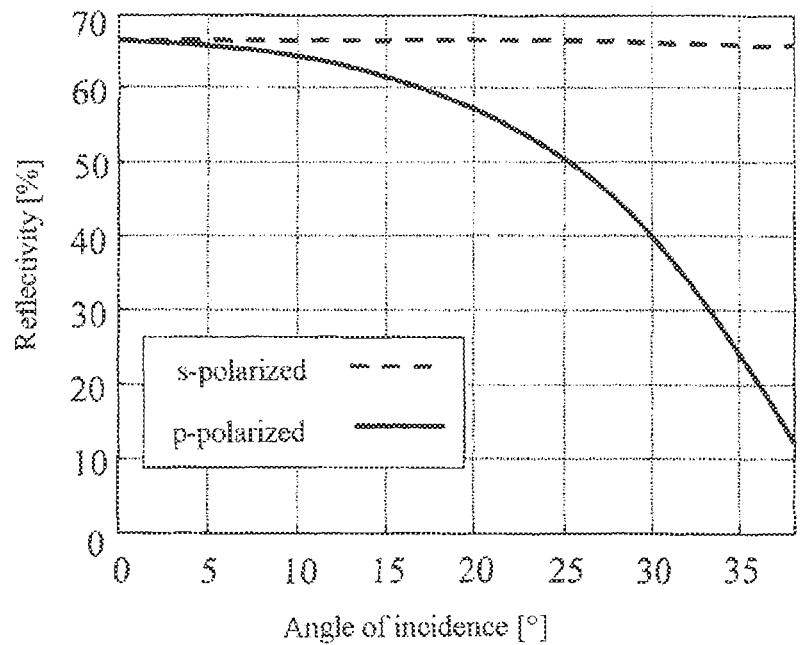
FIG. 3 shows the profile of the reflectivity coefficients for s- and p-polarized radiation as a function of the angle of incidence.

A mirror, for example the collector mirror 5, which is designed for reflecting radiation in the EUV range, that is to say in the range of 5 nm to 20 nm, and is operated with normal incidence, has a substrate with a reflective coating including a plurality of alternating first and second layers arranged one above another. In this case, the first layers include a first material, the refractive index of which for radiation having a wavelength in the range of 5-20 nm is greater than the refractive index of a second material, which the second layers include. The first material can be silicon, for example, and the second material can be molybdenum or ruthenium. Table 1 presents an example of a corresponding layer sequence. In this case, the first row indicates the thickness of the layer lying closest to the substrate, and the last row indicates the thickness of the layer lying furthest away from the substrate. In this case, the topmost layer composed of ruthenium serves for preventing oxidation. Associated with this, FIG. 3 shows the reflectivity of this layer sequence for radiation having a wavelength of 13.5 nm. The intensity reflection coefficient for perpendicularly polarized light (s-polarized, illustrated in a dashed manner) and for parallel-polarized light (p-polarized, solid line) is plotted as a function of the angle of incidence on the corresponding mirror. While the reflectivity of s-polarized and p-polarized light is substantially identical for small angles of incidence in the range of 0-5°, the s-polarized light is reflected significantly better than the p-polarized light at larger angles of incidence. This physical effect has the consequence that the collector mirror 5 illustrated in FIG. 1 at least partly polarizes the unpolarized radiation generated by the light source 43 in the course of reflection. Whereas the angle of incidence of the radiation that emerges from the light source 43 and impinges on the collector mirror 5 is relatively small in the inner collector region 45, the angle of incidence of the radiation in the outer collector regions 47 is usually greater than approximately 25°. Consequently, the radiation reflected by the inner collector mirror region 45 is substantially unpolarized, whereas a significant proportion of the radiation reflected by the outer collector mirror regions 47 is s-polarized. The collector mirror 5 therefore produces a polarization distribution that is applied to the first faceted optical element 7 during the operation of the illumination optical unit. The collector mirror 5 illustrated in FIG. 1 leads, on account of its rotational symmetry, to a tangential polarization distribution on the first faceted optical element 7, this being illustrated schematically in FIG. 4.

TABLE 1

Layer sequence

| Material | Thickness [nm] |
| --- | --- |
| Si | 5.305 |
| Mo | 1.524 |
| Si | 5.241 |
| Mo | 1.625 |
| Si | 5.181 |
| Mo | 1.717 |
| Si | 5.125 |
| Mo | 1.802 |
| Si | 5.072 |
| Mo | 1.878 |
| Si | 5.024 |
| Mo | 1.948 |
| Si | 4.978 |
| Mo | 2.012 |
| Si | 4.935 |
| Mo | 2.070 |
| Si | 4.895 |
| Mo | 2.123 |
| Si | 4.858 |
| Mo | 2.171 |
| Si | 4.823 |
| Mo | 2.215 |
| Si | 4.791 |

TABLE 1-continued

Layer sequence

| Material | Thickness [nm] |
|---|---|
| Mo | 2.255 |
| Si | 4.760 |
| Mo | 2.292 |
| Si | 4.732 |
| Mo | 2.325 |
| Si | 4.706 |
| Mo | 2.356 |
| Si | 4.681 |
| Mo | 2.383 |
| Si | 4.658 |
| Mo | 2.409 |
| Si | 4.636 |
| Mo | 2.432 |
| Si | 4.616 |
| Mo | 2.453 |
| Si | 4.597 |
| Mo | 2.472 |
| Si | 4.580 |
| Mo | 2.489 |
| Si | 4.563 |
| Mo | 2.505 |
| Si | 4.548 |
| Mo | 2.520 |
| Si | 4.534 |
| Mo | 2.533 |
| Si | 4.520 |
| Mo | 2.545 |
| Si | 4.508 |
| Mo | 2.556 |
| Si | 4.496 |
| Mo | 2.566 |
| Si | 4.485 |
| Mo | 2.575 |
| Si | 4.475 |
| Mo | 2.584 |
| Si | 4.465 |
| Mo | 2.591 |
| Si | 4.456 |
| Mo | 2.598 |
| Si | 4.448 |
| Mo | 2.604 |
| Si | 4.440 |
| Mo | 2.610 |
| Si | 4.433 |
| Mo | 2.615 |
| Si | 4.426 |
| Mo | 2.620 |
| Si | 4.420 |
| Mo | 2.625 |
| Si | 4.414 |
| Mo | 2.629 |
| Si | 4.409 |
| Mo | 2.632 |
| Si | 4.404 |
| Mo | 2.635 |
| Si | 4.399 |
| Mo | 2.638 |
| Si | 4.394 |
| Mo | 2.641 |
| Si | 4.390 |
| Mo | 2.644 |
| Si | 4.386 |
| Mo | 2.646 |
| Si | 4.382 |
| Mo | 2.648 |
| Si | 4.379 |
| Mo | 2.650 |
| Si | 4.376 |
| Mo | 2.652 |
| Si | 4.373 |
| Mo | 2.653 |
| Si | 4.370 |
| Mo | 2.655 |
| Si | 4.367 |
| Mo | 2.656 |
| Si | 4.365 |

TABLE 1-continued

Layer sequence

| Material | Thickness [nm] |
|---|---|
| Mo | 2.657 |
| Si | 4.363 |
| Ru | 4.230 |

Figure 4:
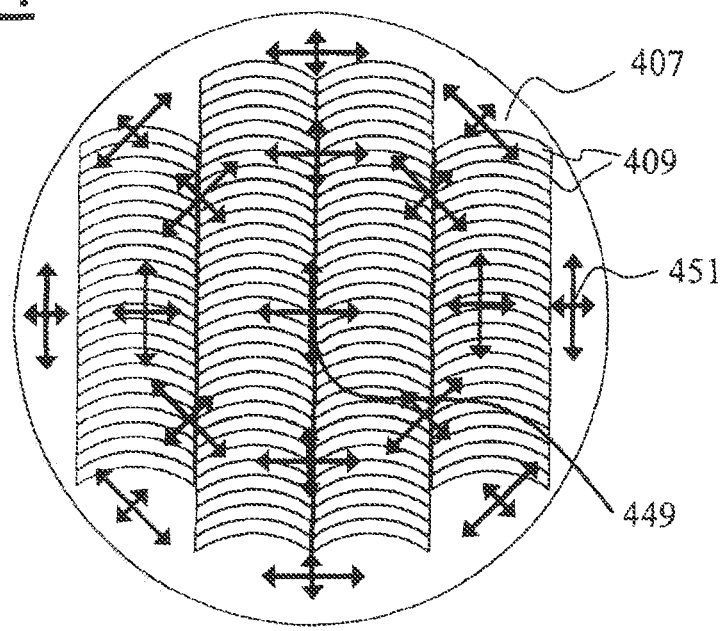
FIG. 4 schematically shows a polarization distribution on a first faceted optical element such as arises on account of the collector mirror according to FIG. 1.

FIG. 4 shows by way of example at 17 locations of the first faceted optical element 407 the polarization of the impinging radiation with the aid of two mutually perpendicular double-headed arrows. In this case, the directions of the two double-headed arrows respectively predefine directions of two mutually perpendicular polarization directions and the ratio of the lengths of the two double-headed arrows is a qualitative measure of the ratio of the intensities of the incident radiation in the respective polarization directions. This can be quantitatively characterized by degree of polarization ρ. In this case, the degree of polarization ρ of the radiation is defined by $$\rho = \frac{I_P - I_S}{I_P + I_S}$$

where $I_P$ and $I_S$ indicate the intensity of the p- and s-polarized radiation, respectively. In the center 449 of the first faceted optical element, the two double-headed arrows have the same length, that is to say that the intensities in the two perpendicular polarization directions are of identical magnitude. Accordingly, substantially unpolarized radiation is present in the center 449 of the first faceted optical element. By contrast, partly polarized radiation is applied to the location 451 on the first faceted optical element 407, wherein the principal polarization direction, represented by the longer double-headed arrow, is perpendicular to the connecting line between the center 449 and the impingement location 451. On account of the rotational symmetry of the collector mirror 5, a corresponding relation arises for the principal polarization direction at each location on the first faceted optical element; this is referred to as a tangential polarization distribution in this case. Radiation having a specific principal polarization direction is thus applied to each first facet element 409 of the first faceted optical element 407, wherein the principal polarization direction can be determined from the location of the first facet element 409 on the first faceted optical element 407. In the present case, a tangential polarization distribution arises wherein the proportion of the radiation in the principal polarization direction, which is represented by the longer double-headed arrow and is perpendicular to the connecting line between the center 449 and the impingement location 451, increases from the center 449 outward. Since each first facet element 409 now has a reflective surface with a normal vector whose direction defines the orientation of the reflective surface spatially, each facet element 409 reflects the incident radiation in a specific direction resulting from the direction of the incident radiation on the facet element and the direction of the associated normal vector. By corresponding definition of the normal vector, the radiation can be directed onto each of the second facet elements of the second faceted optical element 11. Since radiation having different principal polarization directions is applied to the first facet elements 407 of the first faceted optical element 409, it is possible to determine, by suitably selecting the associated normal vectors of the reflective surfaces of the first facet elements 409, which second facet elements 13 have applied to them radiation having which principal polarization direction. By selecting the normal vectors of the reflective surfaces of the first facet elements 407, it is thus possible to establish a predetermined polarization distribution on the second faceted optical element 11.

Figure 5A:
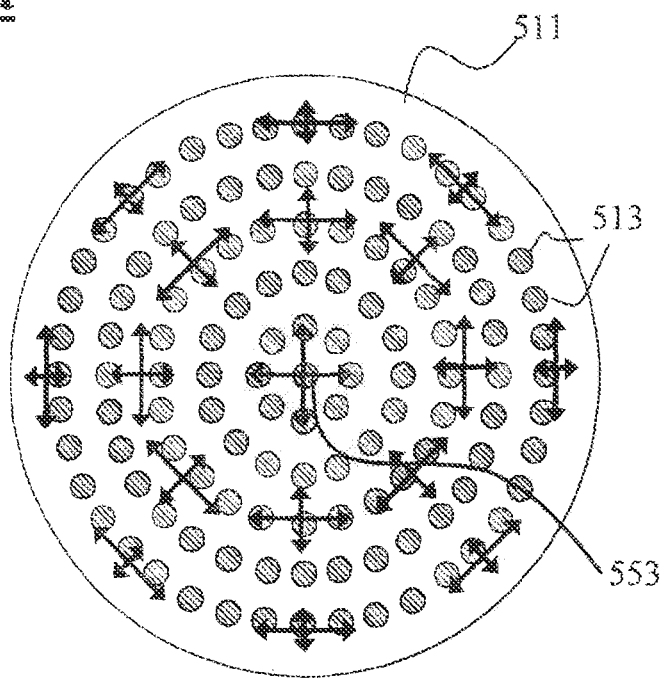
FIG. 5a schematically shows a polarization distribution on the second faceted optical element in a first configuration of the disclosure.

FIG. 5a shows a first example of a predetermined polarization distribution on the second faceted optical element 511. In this case, the principal polarization direction at the different locations of the second faceted optical element is illustrated analogously to FIG. 4 with the aid of mutually perpendicular double-headed arrows. While substantially unpolarized radiation is applied to the second facet elements 513 arranged in the center 553, partly polarized radiation is directed onto the facet elements 513 arranged in the outer region. In this case, the normal vectors of the reflective surfaces of the first facet elements are oriented so that a tangential polarization distribution arises on the second faceted optical element, in the case of which distribution the proportion of the radiation in the tangentially directed principal polarization direction increases from the center 553 outward.

Figure 5B:
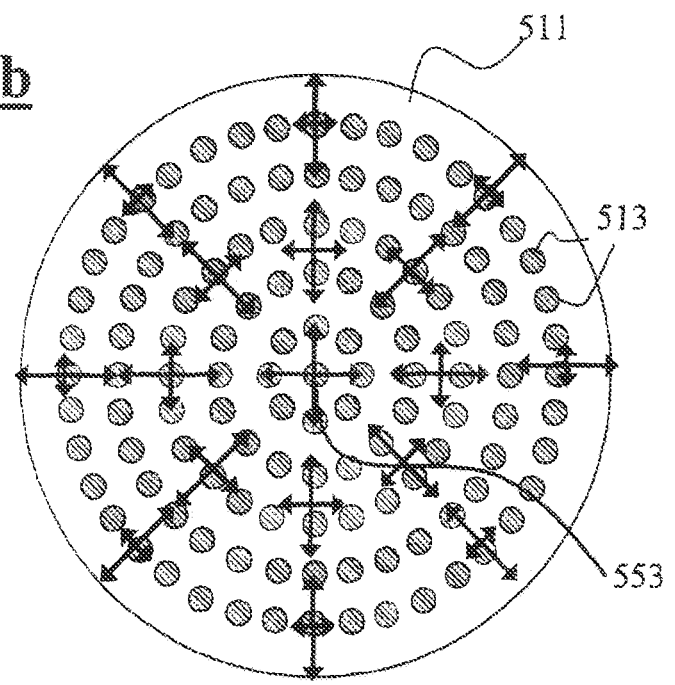
FIG. 5b schematically shows a polarization distribution on the second faceted optical element in a further configuration of the disclosure.
Figure 6A:
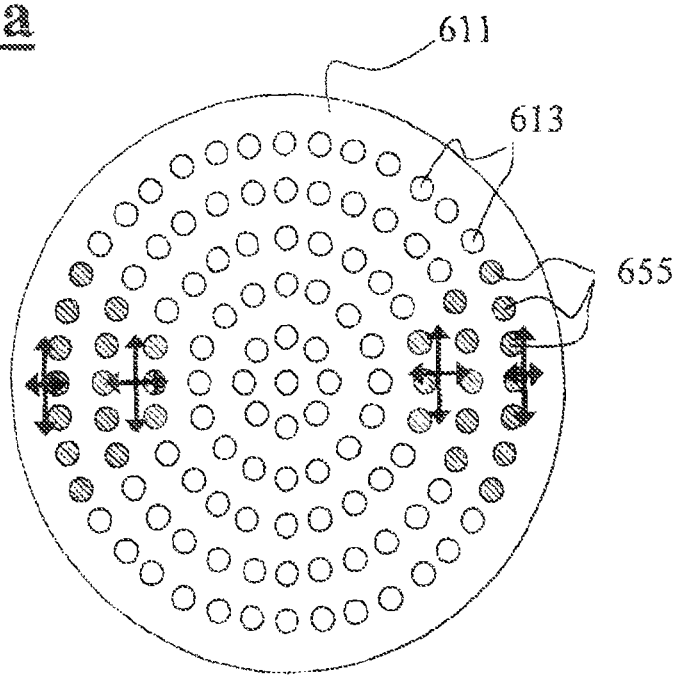
FIG. 6a schematically shows a polarization distribution on the second faceted optical element in a configuration of the disclosure in which the second faceted optical element is illuminated in dipole form.
Figure 6B:
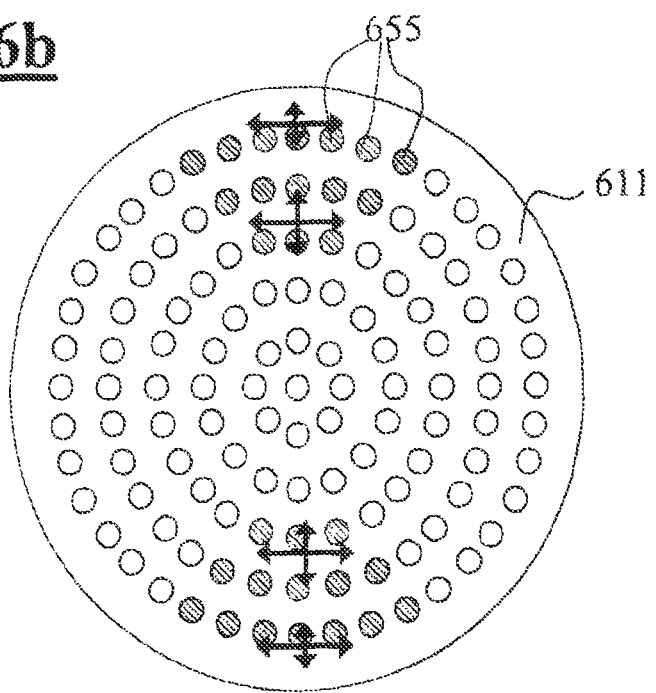
FIG. 6b schematically shows a polarization distribution on the second faceted optical element in a further configuration of the disclosure in which the illumination of the second faceted optical element is in dipole form.

Alternatively, FIG. 5b shows a radial polarization distribution over the second faceted optical element 501, in the case of which distribution the principal polarization direction at each location on the second faceted optical element 511 is directed in the direction of a common center 553.

While radiation is applied to all the second facet elements 513 in FIGS. 5a and 5b, FIGS. 6a and 6b show two exemplary embodiments in which radiation is applied to only some of the second facet elements 613. Facet elements 613 to which radiation is not applied are represented by circles without hatching in FIGS. 5a, 5b, 6a and 6b. The second facet elements 655 to which radiation is applied are arranged in dipole form in FIGS. 6a and 6b. In this case, the dipole is oriented horizontally in FIG. 6a and vertically in FIG. 6b. In this case, the polarization distribution over the second faceted optical element 611 is such that the principal polarization direction of the radiation is substantially perpendicular to the principal dipole axis. Particularly in the embodiments according to FIGS. 6a and 6b, where radiation is not applied to all of the second facet elements 613, for each second facet element 655 to which radiation is applied it is possible to find a suitable first facet element 409 to which radiation having the desired principal polarization direction is applied. For these first facet elements 409, the normal vector of the reflective surface is then chosen in a suitable manner, such that the radiation is directed onto the assigned second facet element. The further first facet elements 409 can be directed, by a suitable choice of the normal vector, for example so that they direct the radiation onto a diaphragm, that is to say that the radiation does not contribute to the illumination of the object field.

In a first configuration of the disclosure, the first facet elements are static, with the result that a fixed polarization distribution on the second faceted optical element is predefined. In a further configuration of the disclosure, the first facet elements are provided with actuators, such that the direction of the normal vector of the assigned reflective surface can be altered and, consequently, during operation can be changed over e.g. between the polarization distributions on the second faceted optical element 511/611 according to FIGS. 5a, 5b, 6a and 6b.

An explanation has been given above, in association with FIGS. 4-6, of how a predetermined polarization distribution on the second faceted optical element 511/611 can be achieved according to the disclosure. The construction of the illumination optical unit according to FIG. 1, wherein the second faceted optical element is arranged in a pupil plane of the illumination optical unit, has a consequence that a predetermined polarization distribution results at each location of the object field. The polarization distribution at a location of the object field is understood to mean a function $\vec{P}(\alpha,\beta)$, which specifies the direction of the polarization and the degree of polarization of the incident radiation as a function of the two angles $\alpha$ and $\beta$ of incidence. Since the second faceted optical element 511/611 is arranged in a pupil plane of the illumination optical unit 3, the polarization distribution over the location on the second faceted optical element 511/611 corresponds in a simple manner to the function $\vec{P}(\alpha,\beta)$, since radiation impinging at an angle $\alpha$, $\beta$ in the object field issues from a specific location (x,y) in a pupil plane.

Figure 7:
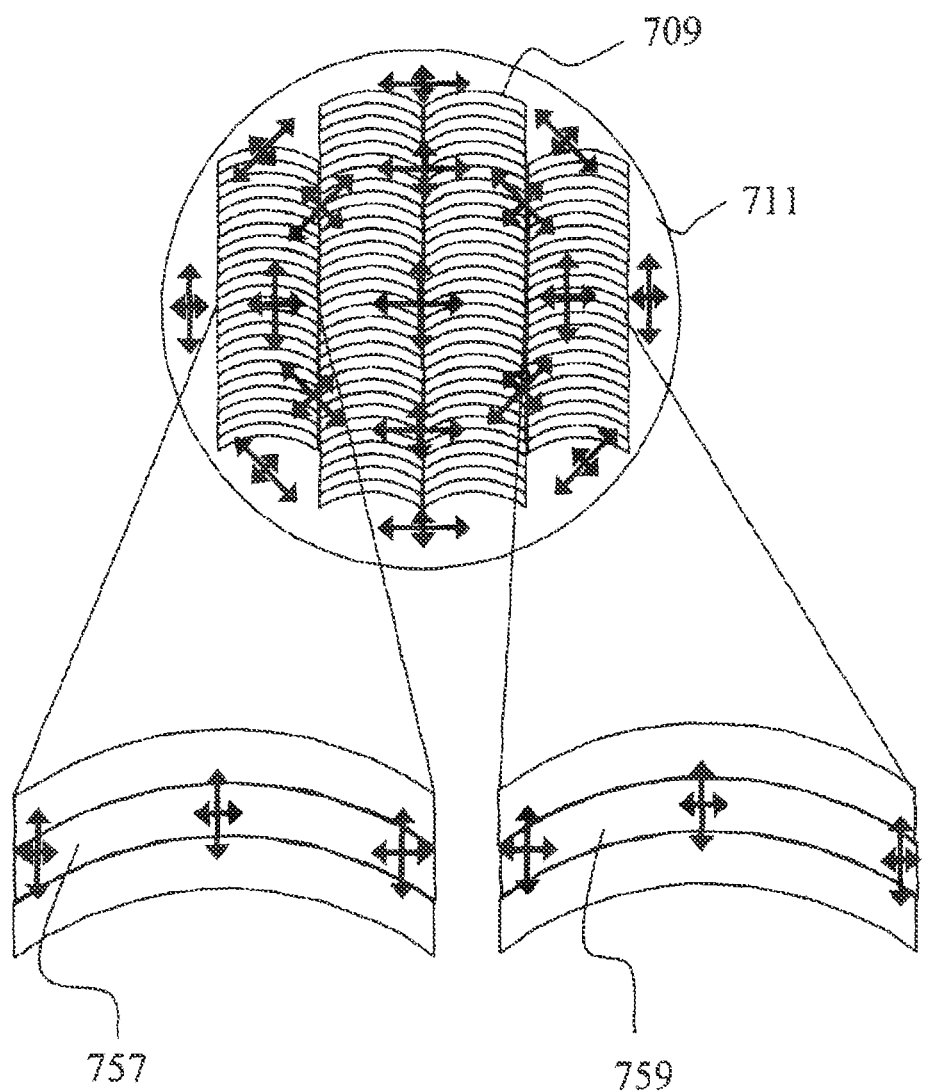
FIG. 7 shows the profile of the polarization distribution of individual facet elements of the first faceted optical element according to FIG. 1.

In the previous considerations it was assumed that the polarization distribution on each facet element of the first faceted optical element 7 does not change over the location on the first facet element. Since the polarization distribution produced by the collector shell 5 on the first faceted optical element changes, however, uniformly from the center to the edge of the first faceted optical element, a slight variation of the polarization distribution over the individual facet elements of the first faceted optical element also inevitably arises. This is illustrated in FIG. 7. FIG. 7 shows the first faceted optical element according to FIG. 4 with a polarization distribution such as is produced by the collector shell 5 according to FIG. 1. Furthermore, FIG. 7 shows two specific facet elements 757 and 759 in an enlarged illustration. On account of the arrangement of the facet elements 757 and 759 on the first faceted optical element 711, on the two facet elements 757 and 759 an alteration of the polarization of the incident radiation arises substantially along the long direction of the facet elements 757 and 759. Thus, on the facet element 757 the degree of polarization decreases along the long direction from left to right, whereas on the facet element 759 the degree of polarization increases along the long direction on the facet element from left to right. This variation of the polarization over the first facet elements 709 has the effect that the polarization distribution in the object field $\vec{P}(\alpha,\beta)$ is additionally dependent on the location in the object field. The polarization distribution in the object field is accordingly actually a function $\vec{P}(x,y,\alpha,\beta)$ where x and y indicate the location in the object field. Particularly in the embodiments described with reference to FIGS. 6a and 6b, wherein not all of the first facet elements contribute to the illumination of the object field because at least part of the radiation is screened out, it is possible, by a suitable choice of the facets which contribute to the illumination of the object field, to achieve a predetermined profile of the polarization distribution in the object field over the location (x, y). This becomes particularly clear when consideration is given to the case in which all first facet elements are screened out, apart from the first facet element 757. In this special case, the location dependence of the polarization distribution in the object field corresponds exactly to the location dependence of the polarization distribution on the first facet element 757.

Figure 8:
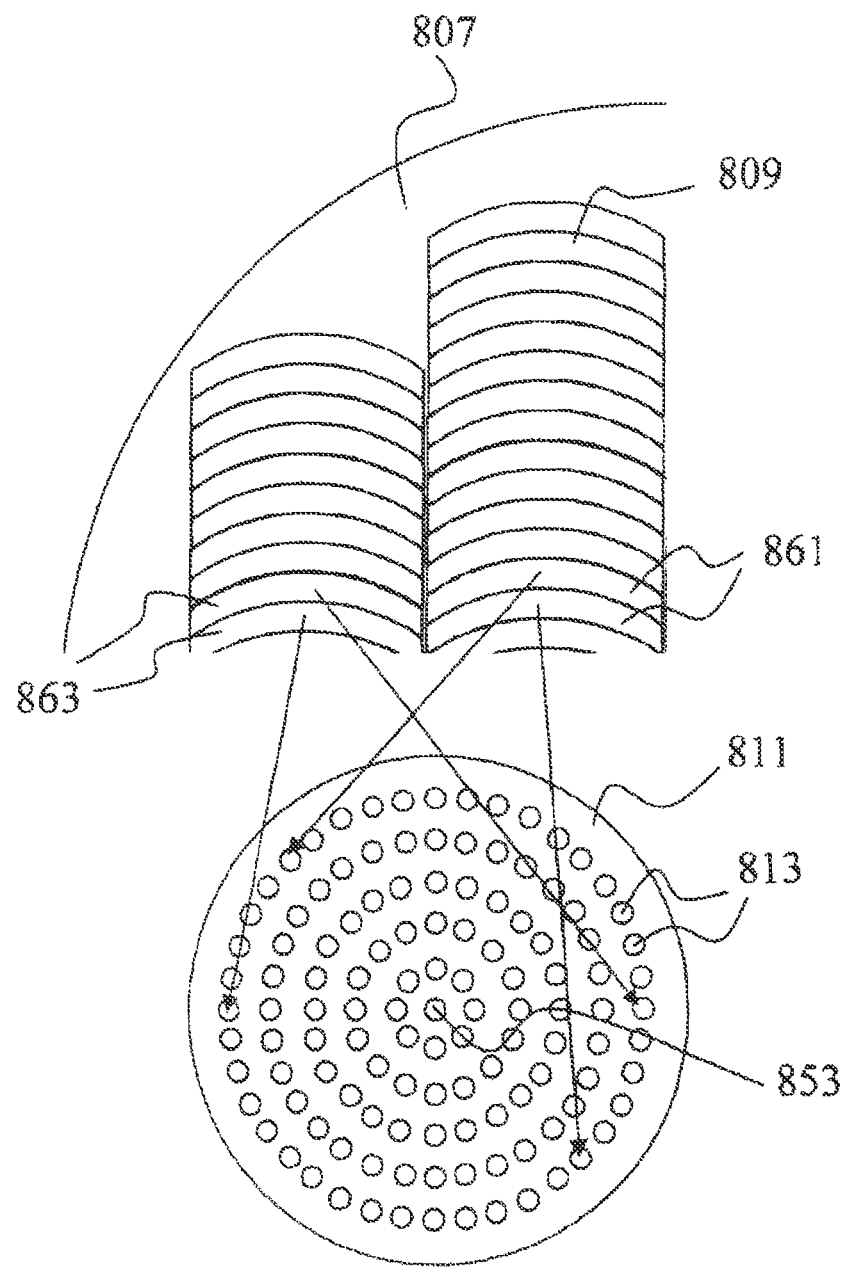
FIG. 8 shows by way of example an assignment of first facet elements to second facet elements which satisfies specific symmetry considerations.

FIG. 8 shows a further configuration of the illumination optical unit according to the disclosure. The illustration shows an enlarged region of the first faceted optical element 807 having first facet elements 809, and also the second faceted optical element 811 having the second facet elements 813. Furthermore, connecting arrows are used to indicate, for four first facet elements 861 and 863, the second facet elements 813 to which they apply radiation. In the case of this assignment it was taken into account that first facet elements 861 and 863 whose centers are closely adjacent to one another are oriented so that they apply radiation to second facet elements arranged centrosymmetrically with respect to the center 853 of the second faceted optical element 811. This assignment is advantageous since both the intensity distribution and the polarization distribution on first facet elements 861 and 863 whose centers are closely adjacent are substantially identical. The assignment of such pairs of first facet elements to second facet elements 813 arranged centrosymmetrically therefore inevitably leads to a centrosymmetric intensity and polarization distribution over the second faceted optical element 811. For many applications this is a preferred variant of the intensity distribution and/or polarization distribution. In addition, slight disturbances of the intensity distribution and/or polarization distribution on the first faceted optical element do not have a very great effect on the centrosymmetry of the distribution on the second faceted optical element 811. This is owing to the fact that, even in the case of a disturbed intensity and/or polarization distribution on the first faceted optical element 807, it is often nevertheless ensured that substantially an identical intensity and/or polarization distribution is applied to first facet elements whose centers are arranged very closely adjacent to one another.

Figure 9:
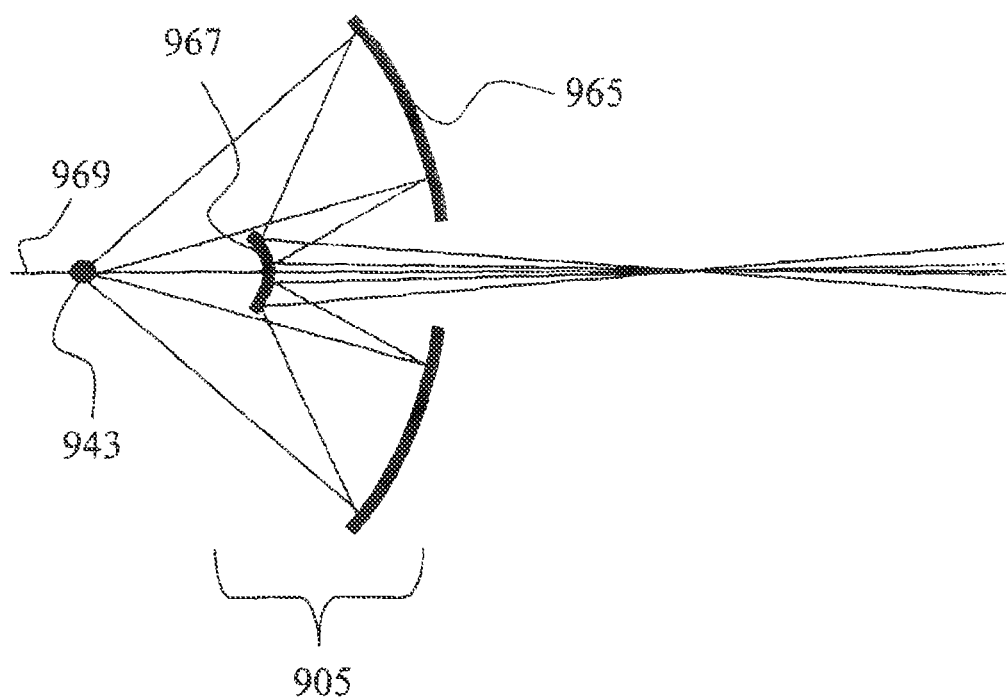
FIG. 9 shows a configuration of the collector mirror in the form of a double collector.

FIG. 9 illustrates a development according to the disclosure of the collector mirror. In this case, the collector mirror 905 is embodied as a double collector having a first reflective surface 965 and a second reflective surface 967, which are both rotationally symmetrical about a common optical axis 969. The radiation emerging from the light source is collected by the first surface 965 and directed onto the second reflective surface 967. In this case, both reflective surfaces 965 and 967 are operated with normal incidence. Therefore, in the course of reflection at both surfaces 965 and 967 a polarization of the radiation takes place, which becomes mutually intensified in this case. This is owing to the fact that the reflection plane of each ray at the first reflective surface 965 coincides with the reflection plane of the same ray at the second reflective surface 967. A reflection plane is understood to mean the plane spanned by the incident ray and the reflective ray. Therefore, radiation which is s-polarized in the course of the first reflection is likewise s-polarized with respect to the second reflection at the second reflective optical surface. The same correspondingly holds true for p-polarized radiation. In both reflections, the s-polarized radiation is reflected better, as explained with reference to FIG. 3. The degree of polarization is therefore increased in a targeted manner by the second reflection. According to the disclosure, such a collector mirror can be used particularly well in the above-described illumination optical unit in order to apply more highly polarized radiation to the first faceted optical element.

What is claimed is:

1. An optical unit configured to illuminate an object field in an object plane, the optical unit comprising:
   a collector mirror; and
   a first faceted optical element comprising a plurality of facet elements comprising a first facet element and a second facet element,
   wherein:
      each the plurality of facet elements comprises a reflective surface having a normal vector whose direction spatially defines an orientation of the reflective surface;
      the collector mirror is configured so that, during use of the optical unit, the collector mirror produces a polarization distribution so that, a polarization applied to the first facet element is different from a polarization applied to the second facet element;
      the first faceted optical element has a first state in which the normal vectors of the reflective surface of each of the plurality of facet elements are configured to produce a polarization distribution at a location of the object field during use of the optical unit; and
      the optical unit is an EUV microlithography optical unit.

2. The optical unit of claim 1, wherein the polarization distribution that is applied to the first faceted optical element during use of the optical unit is different from the polarization distribution results at the location of the object field during use of the optical unit.

3. The optical unit of claim 1, wherein the polarization distribution at a first location of the object field is different from the polarization distribution at a second location of the object field.

4. The optical unit of claim 1, wherein the polarization distribution at the location of the object field is a tangential polarization distribution.

5. The optical unit of claim 1, wherein an angular distribution of incident radiation at the object field has a dipole form at the location of the object field, and each pole a principal polarization direction is perpendicular to a principal dipole axis.

6. The optical unit of claim 1, further comprising a second faceted optical element comprising a plurality of facet elements configured to superimpose an image of the plurality of facet elements of the first faceted element onto the object field during use of the optical unit.

7. The optical unit of claim 1, wherein the first facet element is moveable between first and second positions, and a direction of the normal vector of the reflective surface of the first facet element in the first position differs from a direction of the normal vector of the reflective surface of the first facet element in the second position.

8. The optical unit of claim 7, wherein the polarization distribution at the location of the object field during use of the optical unit is different depending on whether the first facet element is in its first state or its second state.

9. The optical unit of claim 1, wherein the collector mirror is a double collector.

10. The optical unit of claim 1, wherein no polarization element is arranged in a beam path between collector mirror and the first faceted optical element.

11. The optical unit of claim 1, further comprising a polarization element in a beam path between the collector mirror and the first faceted optical element, the polarization element being configured to alter a polarization distribution produced by the collector mirror during use of the optical unit.

12. The optical unit of claim 1, wherein no polarization element is arranged in a beam path between the first faceted optical element and the object field.

13. An apparatus, comprising:
   an optical unit according to claim 1,
   wherein the apparatus is an EUV microlithography projection exposure apparatus.

14. An optical unit configured to illuminate an object field in an object plane, the optical unit comprising:
   a collector mirror;
   a first faceted optical element comprising a plurality of facet elements comprising a first facet element and a second facet element; and
   a second faceted optical element comprising a plurality of facet elements configured to superimpose an image of the plurality of facet elements of the first faceted optical element onto the object field during use of the optical unit,
   wherein:
      each facet element of the plurality of facet elements of the first faceted mirror comprises a reflective surface with a normal vector whose direction spatially defines an orientation of the reflective surface;

the collector mirror is configured to produce a polarization distribution so that a polarization applied to the first facet element is different from a polarization applied to the second facet element;

the first faceted optical element has a first state in which the normal vectors of the reflective surface of each of the plurality of facet elements of the first faceted optical element is configured so that a polarization distribution results on the second faceted optical element during use of the optical unit; and the optical unit is an EUV microlithography optical unit.

15. The optical unit of claim 14, wherein the polarization distribution on the second faceted optical element is a tangential polarization distribution.

16. The optical unit of claim 15, wherein a proportion of the radiation in a tangentially directed principal polarization direction increases from a center of the second faceted optical element outward.

17. The optical unit of claim 14, wherein the first facet element is moveable between first and second positions, and a direction of the normal vector of the reflective surface of the first facet element in the first position differs from a direction of the normal vector of the reflective surface of the first facet element in the second position.

18. The optical unit of claim 17, wherein the polarization distribution at the location of the object field during use of the optical unit is different depending on whether the first facet element is in its first state or its second state.

19. The optical unit of claim 14, wherein the collector mirror is a double collector.

20. The optical unit of claim 14, wherein no polarization element is arranged in a beam path between collector mirror and the first faceted optical element.

21. The optical unit of claim 14, further comprising a polarization element in a beam path between the collector mirror and the first faceted optical element, the polarization element being configured to alter a polarization distribution produced by the collector mirror during use of the optical unit.

22. The optical unit of claim 14, wherein no polarization element is arranged in a beam path between the first faceted optical element and the object field.

23. An apparatus, comprising:
an optical unit according to claim 14,
wherein the apparatus is an EUV microlithography projection exposure apparatus.

* * * * *